United States Patent [19]

Siden

[11] Patent Number: 4,544,802

[45] Date of Patent: Oct. 1, 1985

[54] CIRCUIT CHANGE PIN AND CIRCUIT BOARD ASSEMBLY

[75] Inventor: Dennis C. Siden, Portola Valley, Calif.

[73] Assignee: Raychem Corporation, Menlo Park, Calif.

[21] Appl. No.: 625,927

[22] Filed: Jun. 29, 1984

[51] Int. Cl.⁴ .................... H05K 1/00; H01R 9/09
[52] U.S. Cl. ..................... 174/68.5; 174/166 S; 174/DIG. 8; 339/17 A; 339/DIG. 1
[58] Field of Search ............ 174/68.5, DIG. 8, 166 S; 339/DIG. 17 A, 17 E, 18 B, 18 P; 361/400, 401, 403–406; 411/909

[56] References Cited

U.S. PATENT DOCUMENTS

| 2,918,521 | 12/1959 | Abrams | 174/166 S |
| 3,095,470 | 6/1963 | Dozier | 174/166 S |
| 3,622,941 | 11/1971 | Wetmore | 339/DIG. 1 X |
| 4,207,364 | 6/1980 | Nyberg | 174/DIG. 8 X |
| 4,361,693 | 11/1982 | Jansons | 528/372 X |

FOREIGN PATENT DOCUMENTS 1294510 11/1972 United Kingdom ......... 174/DIG. 8

OTHER PUBLICATIONS

"IBM Technical Disclosure Bulletin" Multiple Wire Termination by Uberbacher, vol. 9, No. 3, 8; 1966; p. 253.

Primary Examiner—A. T. Grimley
Assistant Examiner—Morris H. Nimmo
Attorney, Agent, or Firm—Ira D. Blecker

[57] ABSTRACT

There is disclosed a circuit change pin and a circuit board assembly. The circuit change pin is a termination post which is held in a compliant electrically insulating base. The base is made from a heat-recoverable material which is preferably a poly(aryl ether ketone). When the circuit change pin is used in conjunction with a printed circuit board, there is then a circuit board assembly.

26 Claims, 7 Drawing Figures

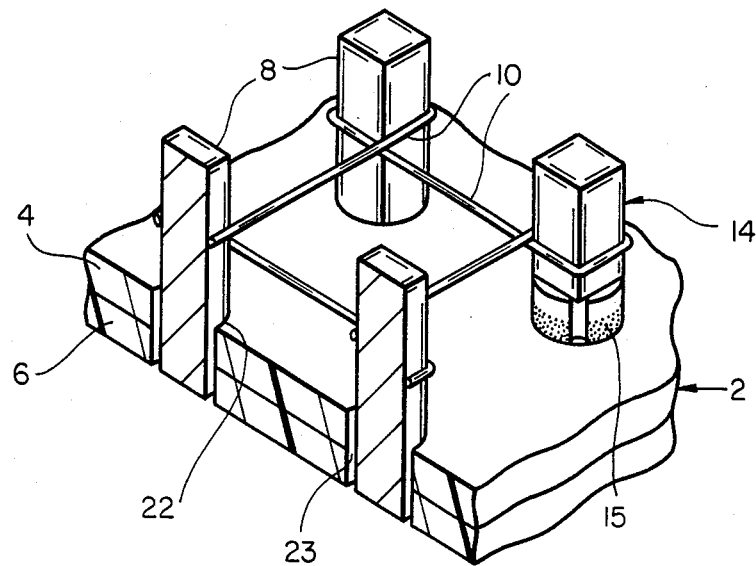
FIG__1
(PRIOR ART)
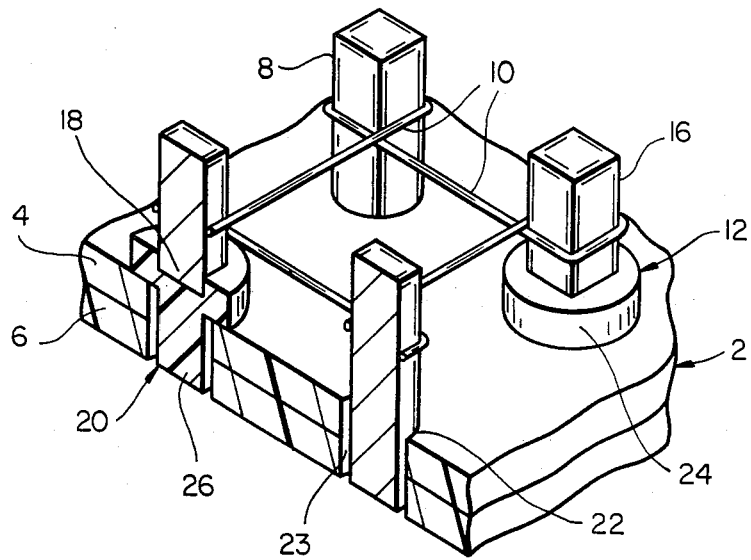
FIG__2

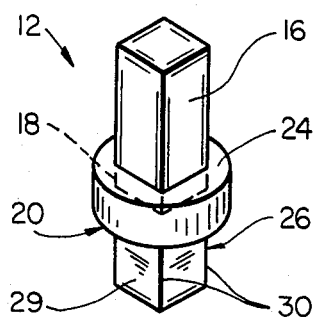
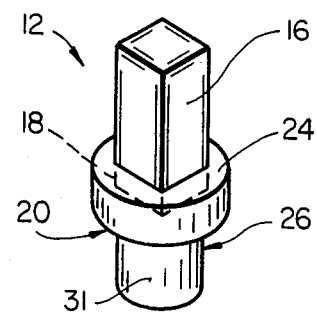
FIG_3     FIG_5
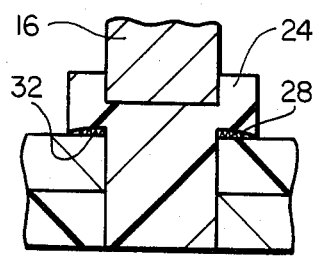
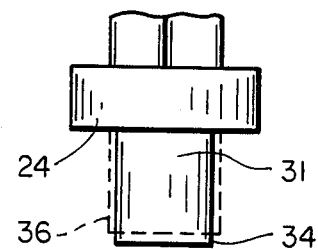
FIG_4     FIG_6
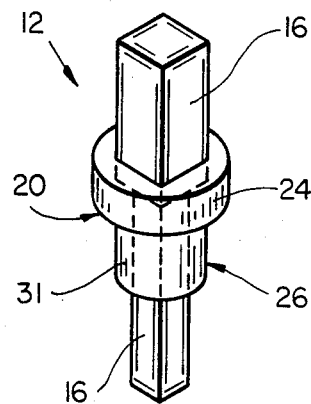
FIG_7

CIRCUIT CHANGE PIN AND CIRCUIT BOARD ASSEMBLY

BACKGROUND OF THE INVENTION

This invention relates to termination posts as used in printed circuit boards and more particularly, relates to those termination posts which may be electrically insulated and, therefore, isolated from the printed circuit board.

While this invention has broad application to termination posts in general, the remainder of the discussion in this specification will be limited to wire wrap posts, a specific type of termination post. However, this limitation is for ease and clarity of discussion only. Whenever in this specification the term "wire wrap post" is used, it should be understood that termination posts in general are also contemplated within the scope of the invention.

Wire wrap posts are an integral part of the circuitry of printed circuit boards, as is well known to those skilled in the art. These wire wrap posts are typically inserted in the "plated-through" holes of the printed circuit boards.

At times, it may be desirable to electrically insulate the wire wrap post so as to isolate it from the plated-through hole. For example, if there is a mistake in the design of the printed circuit board, it would be advantageous to isolate the mistake by isolating the wire wrap post rather than design a new printed circuit board. Another example is the isolating of particular wire wrap posts so as to install design improvements to existing pieces of equipment rather than again, designing a new printed circuit board. In general, it would be desirable to modify the printed board circuit without redesigning the circuit board. This may be accomplished by electrically insulating the wire wrap post to form a circuit change pin.

The current technique for electrically insulating the wire wrap post is to form the bottom part of the wire wrap post into a generally C-shaped, cross-sectional configuration and then coating this part of the wire wrap post, that is, the part that engages the plated-through hole, with an insulating coating. The C-shaped, cross-sectional configuration gives the wire wrap post a certain transverse springiness, which retains the wire wrap post in the plated-through hole. However, the deflection of the C-shaped, cross-sectional configuration is such that the amount of irregularity in the plated-through hole that can be accommodated is limited.

While this prior art insulated wire wrap post has worked generally satisfactorily, it would be desirable to have an improved design. Accordingly, it is an object of this invention to have an improved circuit change pin.

It is another object of the invention to have a circuit change pin that is simple in design and effective in use.

These and other objects of the invention will become apparent after reference to the following description considered in conjunction with the accompanying drawings.

BRIEF DESCRIPTION OF THE INVENTION

According to the invention there is a circuit change pin. This pin is a termination post which is held in a compliant electrically insulating base. The base is made from a heat-recoverable material. It is most preferable that this heat-recoverable material be a poly(aryl ether ketone). When at least one of these circuit change pins is used in conjunction with a printed circuit board then there is a circuit board assembly.

BRIEF DESCRIPTION OF THE DRAWINGS

FIG. 1 is a perspective view of a printed circuit board with wire wrap posts and a prior art circuit change pin.

FIG. 2 is a perspective view of a printed circuit board with wire wrap posts and the circuit change pin of the invention.

FIG. 3 is a perspective view of one embodiment of the circuit change pin of the invention.

FIG. 4 is an enlarged partial sectional view of the bottom part of the circuit change pin of FIG. 3 inserted in a printed circuit board.

FIG. 5 is a perspective view of a second embodiment of the circuit change pin of the invention.

FIG. 6 is an enlarged partial side view of the circuit change pin of FIG. 5.

FIG. 7 is perspective view of a third embodiment of the circuit change pin of the invention.

DETAILED DESCRIPTION OF THE INVENTION

Referring to the drawings in more detail and particularly referring to FIG. 1, there is shown a printed circuit board 2 having several wire wrap posts inserted therein. The circuit board 2 may be made of two or more layers of material. In FIG. 1 there are only two layers 4, 6 shown. The surface of printed circuit board layer 4 would normally be covered with various circuitry as would the top of layer 6.

The printed circuit board 2 has at least one plated-through hole 22. There may, of course, be a plurality of plated-through holes. Each plated-through hole is a hole extending through the various layers of the printed circuit board and has a thin plating along the internal surface 23 thereof. This plating assists in the electrical contact between the wire wrap post and the printed circuit board. In practice, the wire wrap posts would be inserted in the plated-through hole and would serve to connect the various circuits situated within the layers of the printed circuit board. Wires 10, which wrap around the wire wrap posts 8, complete the electrical connection.

Also shown in FIG. 1 is the prior art circuit change pin 14 as explained earlier in the Background of the Invention. The prior art circuit change pin 14 has an insulating coating 15 so as to isolate it from the printed circuit board.

In FIG. 2 there is shown the printed circuit board 2 with wire wrap posts 8. Further shown in FIG. 2 is the circuit change pin 12 of the invention.

As explained in the Background of the Invention, it may be desirable to vary the circuits that are designed into the printed circuit board. In this case, a circuit change pin would be inserted into the printed circuit board. The printed circuit board would have at least one of these circuit change pins. The circuit change pin comprises a wire wrap post 16 which is held by end 18 in a compliant electrically insulating base 20. The base is made from a heat-recoverable material.

The term "heat-recoverable material" should be understood to mean that the material can have the property of heat recovery imparted to it or that the material has, in fact, been made heat recoverable. It is only in the latter situation that the base will actually recover in the course of using the product of the invention.

While, of course, there are many materials which are suitable for use with the invention, the preferred materials are the so-called engineering plastics. The most preferred of these engineering plastics is poly(aryl ether ketone). Poly(aryl ether ketone) is most preferred because it is able to withstand the high temperatures of soldering and is also strong enough to resist the torque that is imposed upon it due to the wrapping of the wire wrap posts.

The term poly(aryl ether ketone) refers to polymers having the repeat unit of the formula

—CO—Ar—CO—Ar'— wherein Ar and Ar' are aromatic moieties at least one of which containing a diaryl ether linkage forming part of the polymer backbone and wherein both Ar and Ar' are covalently linked to the carbonyl groups through aromatic carbon atoms.

Preferably, Ar and Ar' are independently selected from substituted and unsubstituted phenylene and substituted and unsubstituted polynuclear aromatic moieties. The term polynuclear aromatic moieties is used to mean aromatic moieties containing at least two aromatic rings. The rings can be fused, joined by a direct bond or by a linking group. Such linking groups include for example, carbonyl, ether sulfone, sulfide, amide, imide, azo, alkylene, perfluoroalkylene and the like. As mentioned above, at least one of Ar and Ar' contains a diaryl ether linkage.

The phenylene and polynuclear aromatic moieties can contain substituents on the aromatic rings. These substituents should not inhibit or otherwise interfere with the polymerization reaction to any significant extent. Such substituents include, for example, phenyl, halogen, nitro, cyano, alkyl, 2-alkynyl and the like.

Poly(aryl ether ketones) having the following repeat units (the simplest repeat unit being designated for a given polymer) are preferred:

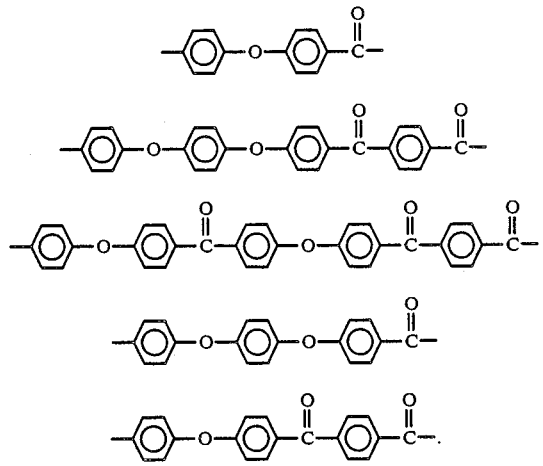

Poly(aryl ether ketones) can be prepared by known methods of synthesis. Preferred poly(aryl ether ketones) can be prepared by Friedel-Crafts polymerization of a monomer system comprising:

(I)
(i) phosgene or an aromatic diacid dihalide together with
(ii) a polynuclear aromatic comonomer comprising:
(a) H—Ar"—O—Ar"—H, (b) H—(Ar"—O)$_n$—Ar"—H wherein n is 2 or 3, (c) H—Ar"—O—Ar"—(CO—Ar"—O—Ar")$_m$—H wherein m is 1, 2 or 3, or (d) H—(Ar"—O)$_n$—Ar"—CO—Ar"—(O—Ar")$_m$—H wherein m is 1, 2 or 3, and n is 2 or 3, or (II) an acid halide of the formula:

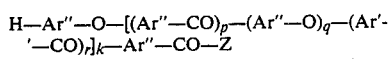
H—Ar"—O—[(Ar"—CO)$_p$—(Ar"—O)$_q$—(Ar'—CO)$_r$]$_k$—Ar"—CO—Z wherein Z is halogen, k is 0, 1 or 2, p is 1 or 2, q is 0, 1 or 2 and r is 0, 1 or 2;

(III) an acid halide of the formula:

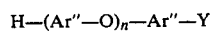
H—(Ar"—O)$_n$—Ar"—Y wherein n is 2 or 3 and Y is CO—Z or CO—Ar'—CO—Z where Z is halogen; wherein each Ar" is independently selected from substituted or unsubstituted phenylene, and substituted and unsubstituted polynuclear aromatic moieties free of ketone carbonyl or ether oxygen groups, in the presence of a reaction medium comprising:

(A) A Lewis acid in an amount of one equivalent per equivalent of carbonyl groups present, plus one equivalent per equivalent of Lewis base, plus an amount effective to act as a catalyst for the polymerization;

(B) a Lewis base in an amount from 0 to about 4 equivalents per equivalent of acid halide groups present in the monomer system; and (C) a non-protic diluent in an amount from 0 to about 93% by weight, based on the weight of the total reaction mixture.

The aromatic diacid dihalide employed is preferably a dichloride or dibromide. Illustrative diacid dihalides which can be used include, for example

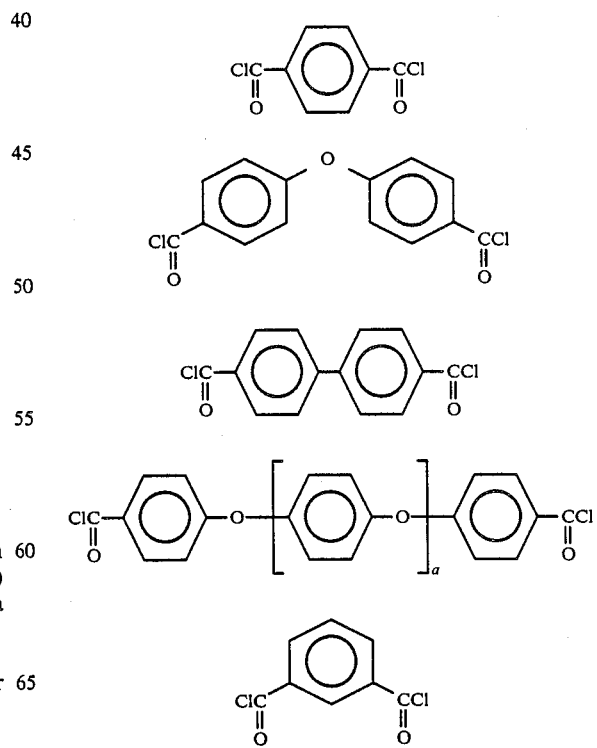

-continued

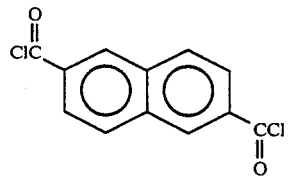

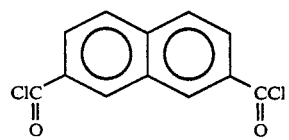

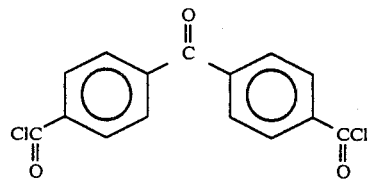

wherein a is 0–4.

Illustrated polynuclear aromatic comonomers which can be used with such diacid halides are:

(a) H—Ar″—O—Ar″—H, which includes, for example:

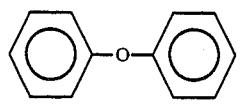

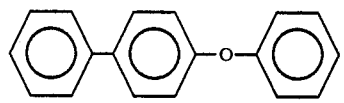

(b) H—(Ar″—O)$_n$—Ar″—H, which include, for example:

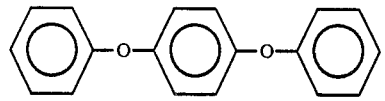

and

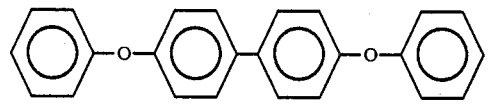

(c) H—Ar″—O—Ar″—(CO—Ar″—O—Ar″)$_m$—H, which includes, for example:

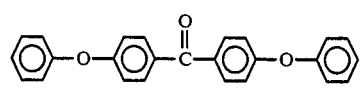

and (d) H—(Ar″—O)$_n$—Ar″—CO—Ar″—(O—Ar″)$_m$—H which includes, for example:

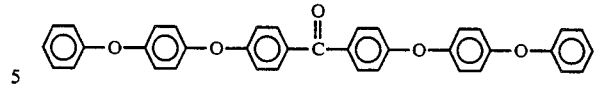

Monomer systems II and III comprise an acid halide. (The term acid halide is used herein to refer to a monoacid monohalide.) In monomer system II, the acid halide is of the formula:

H—Ar″—O—[(Ar″—CO)$_p$—(Ar″—O)$_q$—(Ar′—CO)$_r$]$_k$—Ar″—CO—Z.

Such monomers include for example, where k=0

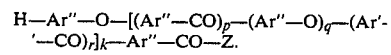

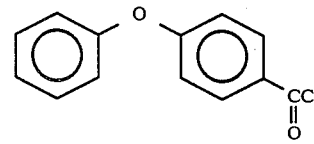

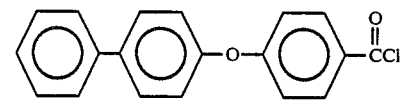

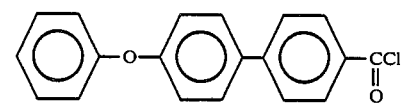

and where k=1:

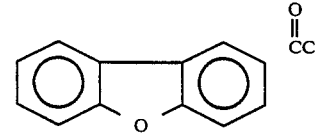

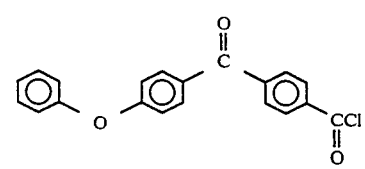

In monomer system III, the acid halide is of the formula

H—(Ar″—O)$_n$—Ar″—Y.

Examples of such acid halides include

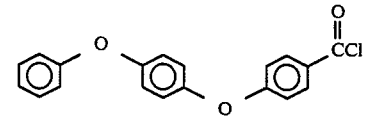

and

-continued

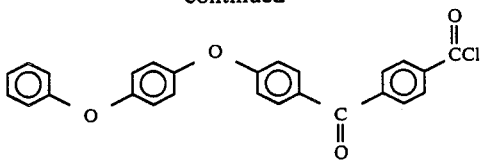

It is to be understood that combinations of monomers can be employed. For example, one or more diacid dihalides can be used with one or more polynuclear aromatic comonomers as long as the correct stoichiometry is maintained. Further, one or more acid halides can be included. In addition monomers which contain other linkages such as those specified above, can be employed as long as one or more of the comonomers used contains at least one ether oxygen linkage. Such comonomers include for example:

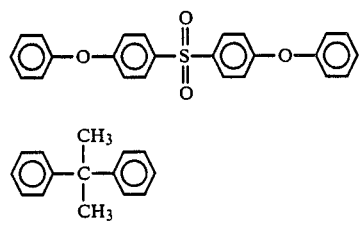

which can be used as the sole comonomer with an ether containing diacid dihalide or with phosgene or any diacid dihalide when used in addition to a polynuclear aromatic comonomer as defined in I(ii)(a), I(ii)(b), I(ii)(c) or I(ii)(d). Similarly

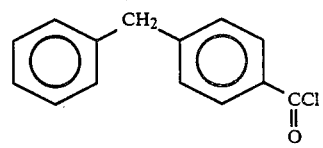

can be used as a comonomer together with an ether-containing polynuclear aromatic acid halide or as an additional comonomer together with a monomer system as defined in I.

The monomer system can also contain up to about 30 mole % of a comonomer such as a sulfonyl chloride which polymerizes under Friedel-Crafts conditions to provide ketone/sulfone copolymers.

Further details of this process for producing poly(aryl ether ketone) can be found in commonly assigned co-pending U.S. application Ser. No. 594,503, filed Mar. 31, 1984, the disclosure of which is incorporated herein by reference.

Still referring to FIG. 2, it can be seen that the base 20 of the circuit change pin 12 is comprised of two portions of different dimensions. The base 20 has a first portion 24 for receiving the wire wrap post and a second portion 26 for inserting into one of the plated through holes 22 of the printed circuit board 2. The first portion 24 is larger in cross section than the second portion so as to form a stepped cross-sectional configuration. As can be seen, the wire wrap post is smaller in cross section than the first portion of the base. This is necessary so that there is sufficient strength in the base to hold the wire wrap post.

The wire wrap post is illustrated in the Figures as having a rectangular configuration. It has been found that a rectangular configuration is the preferred configuration in that it aids in improving the contact between the wire wrap post and the wires. In the alternative, the cross-sectional configuration of the wire wrap post may be nonrectangular, e.g., circular.

An enlarged view of one embodiment of the wire wrap post of FIG. 2 is now shown in FIGS. 3 and 4. In the embodiment of FIGS. 3 and 4 the second portion of the base 26 has a noncircular cross section 29. It is preferred that this second portion cross section be rectangular as clearly shown in FIG. 3.

Particularly referring to FIG. 4, it is also preferable that the first portion 24 of the base have a concave surface 28 facing the second portion 29 of the base. The purpose of this concave surface will become apparent hereafter.

An important advantage of the circuit change pins of the invention is that the circuit change pins when inserted into the plated-through holes self-size to the exact dimensions of the hole no matter how irregular the hole.

This may be illustrated first with respect to the circuit change pin of FIG. 3. Second portion 29 of the circuit change pin is made slightly larger than the plated-through hole. Then, when the circuit change pin is actually inserted into the plated-through hole, these edges 30 of second portion 29 are rubbed off and accumulate near the top of the second portion 29 of the base. These rubbed-off edges 30 represent the excess of the second portion. The remainder of the second portion, i.e., that part in the plated-through hole, exactly fits the dimensions of the plated-through hole. However, when the pin is fully inserted in the hole (or at least inserted as far as it will go), this accumulation 32 of the rubbed-off portions of the second portion 29 of the base will accumulate underneath the first portion of the base which will prevent the circuit change pin from becoming fully engaged in the printed circuit board. The concave surface 28 remedies this situation by accommodating the accumulation 32 of these rubbed-off portions so that the base will lie flat on top of the printed circuit board as shown in FIG. 4.

Another embodiment of the circuit change pin is shown in FIGS. 5 and 6. This embodiment of a circuit change pin is similar to the embodiment shown in FIGS. 3 and 4 except that the second portion of the base now has a circular cross section 31.

It is preferred that the second portion of the base, when it has a circular cross section, has a recovered condition and an unrecovered condition. Referring particularly to FIG. 6, the second portion 31 in the recovered condition, as shown by dotted lines 36, is axially shorter and radially larger than the second portion in the unrecovered position, as shown by solid lines 34. The second portion in the recovered condition, by radially expanding, thus retains the second portion in the plated-through hole of the printed circuit board.

When the embodiment of FIGS. 5 and 6 is used in practice, the second portion 31 would be inserted into one of the plated-through holes of the printed circuit board and then either when the board is soldered or when any other external heat source is applied the second portion of the base would recover and radially expand so as to lock itself in the hole. Thus, this embodiment of the circuit change pin would also self-size to the exact dimensions of the hole no matter how irregular.

It is contemplated within the scope of the invention that even when the second portion has a noncircular cross section, as shown in FIGS. 3 and 4, the second portion may have a recovered and unrecovered condition. When this is the case, the second portion will recover upon exposure to a heat source as just described above. This embodiment, of course, will also self-size to the exact dimensions of the hole.

An advantage of the heat recovery aspect of the second portion, in addition to self-sizing and locking, is that due to being axially shorter when recovered, the entire base will be pulled down onto the printed circuit board. Any possible wobbling of the circuit change pin is thus averted.

A further embodiment of the circuit change pin is now shown in FIG. 7. This embodiment of the circuit change pin is similar to the embodiment shown in FIGS. 3 to 6 except that the wire wrap post 16, while still being held by the base 20, now extends entirely through and beyond the base 20.

As shown, the embodiment of FIG. 7 has a second portion circular cross section 31; however, this embodiment may alternatively have a noncircular cross section 30 (not shown) similar to that of the FIGS. 3 and 4 embodiment. In either case, the circuit change pin would self-size to the exact dimensions of the hole as before described.

The FIG. 7 embodiment is most typically used in the situation, among others, where it is desirable to have wire wrap posts on opposite sides of a printed circuit board.

It is expected that the circuit change pin could be sold as a separate article of commerce or the circuit change pin could be sold in conjunction with printed circuit boards as a circuit board assembly.

It will be obvious to those skilled in the art having regard to this disclosure that other modifications of this invention beyond those embodiments specifically described here may be made without departing from the spirit of the invention. Accordingly, such modifications are considered to be within the scope of the invention as limited solely by the appended claims.

I claim:

1. A circuit change pin comprising a termination post held in a compliant electrically insulating base, wherein said base is made from a heat-recoverable material and is solid except wherein said termination post is held in said base.

2. A circuit change pin comprising a termination post held in a compliant electrically insulating base, wherein said base is made from a heat-recoverable material and wherein said base has a first portion receiving said termination post and a second portion for inserting into a printed circuit board, said first portion being larger in cross-section than said second portion so as to form a stepped cross-sectional configuration.

3. The circuit change pin of claim 2 wherein said heat recoverable material is a poly(aryl ether ketone).

4. The circuit change pin of claim 3 wherein the poly(aryl ether ketone) is poly(p-carbonyl-phenylene-p-oxy-phenylene).

5. Tthe circuit change pin of claim 3 wherein the poly(aryl ether ketone) is poly(p-carbonyl-phenylene-p-oxy-phenylene-p-oxy-phenylene).

6. The circuit change pin of claim 2 wherein said termination post is smaller in cross-section than said first portion of said base.

7. The circuit change pin of claim 2 wherein said termination post is smaller in cross section than said second portion of said base.

8. The circuit change pin of claim 2 wherein said second portion of said base has a noncircular cross-section.

9. The circuit change pin of claim 8 wherein said second portion cross section of said base is rectangular.

10. The circuit change pin of claim 9 wherein said first portion of said base has a concave surface facing said second portion of said base.

11. The circuit change pin of claim 8 wherein said first portion of said base has a concave surface facing said second portion of said base.

12. The circuit change pin of claim 2 wherein said second portion of said base has a circular cross section.

13. The circuit change pin of claim 2, wherein said second portion of said base has a recovered condition and an unrecovered condition, said second portion in the recovered condition is axially shorter and radially larger than said second portion in the unrecovered condition.

14. A circuit board assembly comprising a printed circuit board and at least one circuit change pin; said printed circuit board having at least one plated-through hole; said circuit change pin comprising a termination post held in a compliant electrically insulating base, wherein said base is made from a heat recoverable material and is solid except wherein said termination post is held in said base; said circuit change pin base engaging the plated through hole of said printed circuit board.

15. A circuit board assembly comprising a printed circuit board and at least one circuit change pin; said printed circuit board having at least one plated-through hole; said circuit change pin comprising a termination post held in a compliant electrically insulating base, wherein said base is made from a heat-recoverable material; wherein said circuit change pin base has a first portion receiving said termination post and a second portion inserted into said one of the plated-through holes of said printed circuit board; said first portion being larger in cross section than said second portion so as to form a stepped cross-sectional configuration; said circuit change pin base engaging the plated through hole of said printed circuit board.

16. The circuit board assembly of claim 15 wherein said heat-recoverable material is a poly(aryl ether ketone).

17. The circuit board assembly of claim 16 wherein the poly(aryl ether ketone) is poly(p-carbonyl-phenylene-p-oxy-phenylene).

18. The circuit board assembly of claim 16 wherein the poly(aryl ether ketone) is poly(p-carbonyl-phenylene-p-oxy-phenylene-p-oxy-phenylene).

19. The circuit board assembly of claim 15 wherein said termination post is smaller in cross section than said first portion of said base.

20. The circuit board assembly of claim 15 wherein said termination post is smaller in cross section than said second portion of said base.

21. The circuit board assembly of claim 15 wherein said second portion of said base has a noncircular cross section.

22. The circuit board assembly of claim 21 wherein said second portion cross section of said base is rectangular.

23. The circuit board assembly of claim 22 wherein said first portion of said base has a concave surface facing said second portion of said base.

24. The circuit board assembly of claim 21 wherein said first portion of said base has a concave surface facing said second portion of said base.

25. The circuit board assembly of claim 15 wherein said second portion of said base has a circular cross section.

26. The circuit assembly of claim 15 wherein said second portion of said base has a recovered condition and an unrecovered condition, said second portion in the recovered condition is axially shorter and radially larger than said second portion in the unrecovered condition, said second portion in the recovered condition retaining said second portion in the plated through hole of said printed circuit board.

* * * * *